US011183574B2

(12) United States Patent
Cheng et al.

(10) Patent No.: US 11,183,574 B2
(45) Date of Patent: Nov. 23, 2021

(54) WORK FUNCTION LAYERS FOR TRANSISTOR GATE ELECTRODES (71) Applicant: TAIWAN SEMICONDUCTOR MANUFACTURING CO., LTD., Hsinchu (TW)

(72) Inventors: Chung-Liang Cheng, Taiwan (TW); Ziwei Fang, Hsinchu (TW); Chun-I Wu, Taipei (TW); Huang-Lin Chao, Taiwan (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/690,645

(22) Filed: Nov. 21, 2019

(65) Prior Publication Data

US 2020/0373400 A1 Nov. 26, 2020

Related U.S. Application Data (60) Provisional application No. 62/852,626, filed on May 24, 2019.

(51) Int. Cl.
*H01L 29/423* (2006.01)
*H01L 29/66* (2006.01)
(Continued)

(52) U.S. Cl.
CPC ............ *H01L 29/42372* (2013.01); *H01L 21/823431* (2013.01); *H01L 21/823443* (2013.01);
(Continued)

(58) Field of Classification Search
CPC .......... H01L 2029/7858; H01L 27/088; H01L 27/092; H01L 21/82345; H01L 21/823842;
(Continued)

(56) References Cited

U.S. PATENT DOCUMENTS 7,015,116 B1 3/2006 Lo et al.
7,407,882 B1 * 8/2008 Wang ................ H01L 21/28518
438/649

(Continued)

FOREIGN PATENT DOCUMENTS

KR 20130100656 A 9/2013
KR 20170063353 A 6/2017
(Continued)

OTHER PUBLICATIONS

Tan, Philip Beow Yew, et al., "Measuring STI Stress Effect on CMOS Transistor by Stepping through the Channel Width," 2006 International RF and Microwave Conference Proceedings (Sep. 12-14, 2006), 3 pages.

(Continued)

*Primary Examiner* — Julia Slutsker
(74) *Attorney, Agent, or Firm* — Sterne, Kessler, Goldstein & Fox P.L.L.C.

(57) ABSTRACT

The embodiments described herein are directed to a method for the fabrication of transistors with aluminum-free n-type work function layers as opposed to aluminum-based n-type work function layers. The method includes forming a channel portion disposed between spaced apart source/drain epitaxial layers and forming a gate stack on the channel portion, where forming the gate stack includes depositing a high-k dielectric layer on the channel portion and depositing a p-type work function layer on the dielectric layer. After depositing the p-type work function layer, forming without a vacuum break, an aluminum-free n-type work function layer on the p-type work function layer and depositing a metal on the aluminum-free n-type work function layer. The method further includes depositing an insulating layer to surround the spaced apart source/drain epitaxial layers and the gate stack.

20 Claims, 11 Drawing Sheets (51) Int. Cl.
*H01L 21/8234* (2006.01)
*H01L 29/78* (2006.01)

(52) U.S. Cl.
CPC ...... *H01L 29/66795* (2013.01); *H01L 29/785* (2013.01); *H01L 2029/7858* (2013.01)

(58) Field of Classification Search
CPC ......... H01L 29/42392; H01L 29/66439; H01L 29/78696; H01L 29/0665; H01L 29/49; H01L 21/28008
See application file for complete search history.

(56) References Cited

U.S. PATENT DOCUMENTS

| | | | |
|---|---|---|---|
| 8,962,400 | B2 | 2/2015 | Tsai et al. |
| 9,093,514 | B2 | 7/2015 | Tsai et al. |
| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,245,805 | B2 | 1/2016 | Yeh et al. |
| 9,397,097 | B2 | 7/2016 | Lee et al. |
| 9,418,897 | B1 | 8/2016 | Ching et al. |
| 9,520,482 | B1* | 12/2016 | Chang ............ H01L 21/823437 |
| 9,548,303 | B2 | 1/2017 | Lee et al. |
| 9,564,489 | B2 | 2/2017 | Yeo et al. |
| 9,576,814 | B2 | 2/2017 | Wu et al. |
| 9,601,342 | B2 | 3/2017 | Lee et al. |
| 9,608,116 | B2 | 3/2017 | Ching et al. |
| 9,812,363 | B1 | 11/2017 | Liao et al. |
| 9,859,380 | B2 | 1/2018 | Lee et al. |
| 10,340,358 | B2 | 7/2019 | Suh et al. |
| 10,381,439 | B2 | 8/2019 | Tung |
| 10,410,933 | B2 | 9/2019 | Xie et al. |
| 10,453,750 | B2 | 10/2019 | Pawlak et al. |
| 11,004,934 | B2 | 5/2021 | Fung et al. |
| 2003/0211736 | A1* | 11/2003 | Ludviksson .......... C23C 16/045 438/683 |
| 2014/0246734 | A1* | 9/2014 | Kim .................. H01L 21/28088 257/410 |
| 2016/0225871 | A1* | 8/2016 | Cheng ............. H01L 21/823842 |
| 2016/0254158 | A1* | 9/2016 | Kim .................. H01L 21/28158 438/591 |
| 2017/0103948 | A1* | 4/2017 | Lee .................... H01L 21/76864 |
| 2017/0309629 | A1 | 10/2017 | Ching et al. |
| 2017/0358658 | A1 | 12/2017 | Rios et al. |
| 2018/0083116 | A1 | 3/2018 | Ando et al. |
| 2019/0067435 | A1 | 2/2019 | Badaroglu et al. |
| 2019/0165117 | A1* | 5/2019 | Chiang ............ H01L 21/28088 |
| 2019/0305102 | A1* | 10/2019 | Lavric ............. H01L 21/823842 |
| 2019/0305106 | A1* | 10/2019 | Bi ........................ H01L 29/6653 |
| 2020/0118891 | A1* | 4/2020 | Cheng .................. H01L 29/775 |

FOREIGN PATENT DOCUMENTS

| | | |
|---|---|---|
| KR | 20190028061 A | 3/2019 |
| TW | 201624715 A | 7/2016 |
| TW | 201736249 A | 10/2017 |
| TW | 201901761 A | 1/2019 |
| TW | 201904864 A | 2/2019 |

OTHER PUBLICATIONS

Luo, Jie-Xin, et al., "The Impact of Shallow-Trench-Isolation Mechanical Stress on the Hysteresis Effect of Partially Depleted Silicon-on-Insulator n-Type Metal-Oxide-Semiconductor Field Effects," CHIN.PHYS.LETT. vol. 31, No. 12 (2014) 126601, 4 pages.

Yang, Wenwei, et al., "Analysis of GIDL Dependence on STI-induced Mechanical Stress," Institute of Microelectronics, Tsinghua University, Beijing, China, (2005), 4 pages.

* cited by examiner

WORK FUNCTION LAYERS FOR TRANSISTOR GATE ELECTRODES

CROSS-REFERENCE TO RELATED APPLICATION

This application claims the benefit of U.S. Provisional Patent Application No. 62/852,626, titled "Work Function Layers for Transistor Gate Electrodes," which was filed on May 24, 2019 and is incorporated herein by reference in its entirety.

BACKGROUND

The threshold voltage of a transistor (e.g., n- or p-type transistor) can be tuned by adjusting the thickness of work function layers within the transistor's gate structure. However, scaling the transistor gate structure to manufacture smaller devices introduces challenges in threshold voltage tuning as adjustments to the work function layer thickness is limited due to a decrease in the transistor's dimensions.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of a target value (e.g., ±1%, +2%, +3%, +4%, and +5% of the target value).

The term "vertical," as used herein, means nominally perpendicular to the surface of a substrate.

The term "insulating layer", as used herein, refers to a layer that functions as an electrical insulator (e.g., a dielectric layer).

The layers within a gate structure or gate stack of a field effect transistor (FET) control, in part, the transistor's threshold voltage. More particularly, the threshold voltage value of a transistor depends on the collective thickness and type of the layers included in its gate stack. Therefore, by controlling the thickness of these layers (or the number of layers) in each FET, FETs can be manufactured with different threshold voltages. For example, FETs with a low threshold voltage (e.g., between about 80 mV and about 160 mV) can be used for the "low" or "ultra-low" power applications within a chip, and FETs with high threshold voltage (e.g., greater than about 200 mV) can be used for high power applications within the chip.

Due to the continuous device scaling and the push for low power portable devices (e.g., mobile phones, smart watches and other wearable electronic devices, tablets, etc.), there is a demand for integrated circuits (ICs) with transistors having lower threshold voltages. P-type FETs and n-type FETs can have a different "absolute" threshold voltage value (e.g., the magnitude of the threshold voltage without regard to its sign) because they include different types and/or number of metal layers in their gate stacks. For example, p-type FETs have a higher threshold voltage than n-type FETs and thus require a higher voltage to turn-on (e.g., to allow current to flow between the source and the drain terminals of the transistor). For this reason, n-type FETs may be referred to as "strong" compared to p-type FETs, and p-type FETs may be referred to as "weak" compared to n-type FETs.

In n-type FETs, a way to further reduce (e.g., lower) the threshold voltage is to increase the thickness of the aluminum-containing n-type work function layers, such as titanium-aluminum (TiAl) or titanium-aluminum-carbon (TiAlC), formed in the FET's gate stack. However, a thickness increase for the TiAl or TiAlC layers can be limited by scaling constraints for FETs having challenging gate stack geometries, such as gate-all-around (GAA) nano-sheet FETs (thereafter "NSFETs"). For example, as the nano-sheet to nano-sheet spacing decreases, the available space for the TiAl or TiAlC layers shrinks. Thus, increasing the thickness of the TiAl or TiAlC layer in an n-type NSFETs can become challenging. For example, due to small nano-sheet to nano-sheet spacing (e.g., between about 8 nm and about 12 nm), existing or thicker TiAl or TiAlC layers (e.g., equal to or greater than about 2.5 nm) can lead to poor gate stack gap-fill-which can in-turn lead to voids in the gate stack and variations in the gate stack resistance across the transistors.

The embodiments described herein are directed to a method for the fabrication of transistors with aluminum-free n-type work function layers, which are thinner than aluminum-based n-type work function layers such as TiAl and TiAlC. As a result, the aluminum-free n-type work function layers described herein can mitigate the challenges arising from poor gate stack gap fill noted above. In some embodiments, the aluminum-free n-type work function layers can be grown to a thickness between about 5 Å and about 15 Å, which is at least about 10 Å thinner than aluminum-based n-type work function layers. In some embodiments, the aluminum-free n-type work function layers include titanium silicide ($TiSi_x$), tantalum silicide ($TaSi_x$), cobalt silicide ($CoSi_x$), or nickel silicide ($NiSi_x$) and are formed in-situ (e.g., without a vacuum break) with the p-type work function layers of the gate stack.

Figure 1:
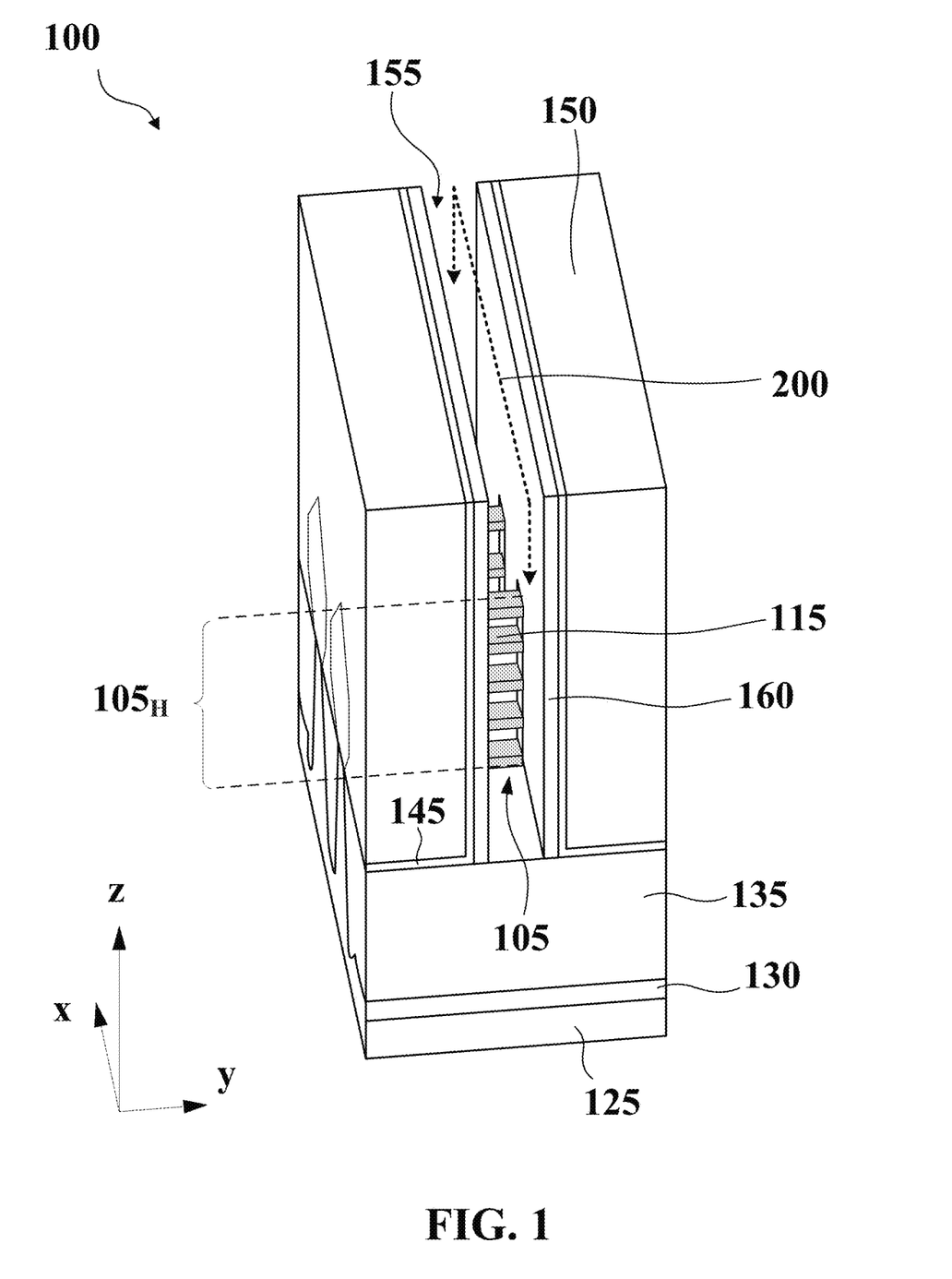
FIGS. 1 and 2 are isometric views of a partially fabricated gate-all-around nano-sheet FET structure, in accordance with some embodiments.
Figure 2:
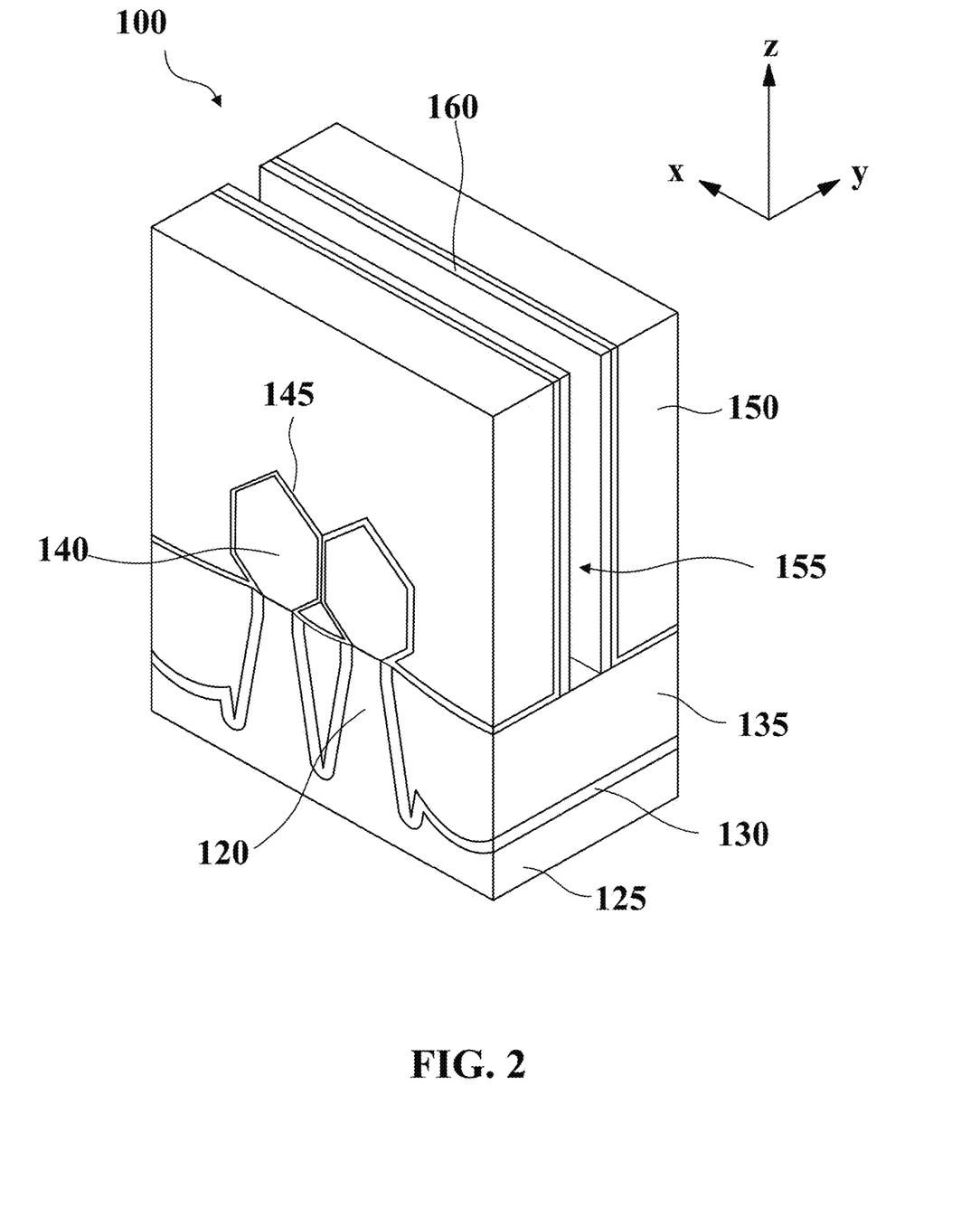

FIGS. 1 and 2 are isometric views of a partially fabricated NSFET 100 after the removal of a sacrificial gate stack. In some embodiments, FIG. 2 shows partially fabricated NSFET 100 of FIG. 1 after being rotated counter clock wise around the z-axis by about 45°. In other words, FIG. 2 is another view of fabricated NSFET 100 shown in FIG. 1. As shown in FIG. 1, partially fabricated NSFET 100 includes one or more multilayer nano-sheet stacks 105 with spaced-apart nano-sheet layers 115. In some embodiments, nano-sheet layers 115 are epitaxially grown during an earlier fabrication operation as part of fin structures 120 shown in FIG. 2. In some embodiments, nano-sheet layers 115 include crystalline silicon (Si) and form a channel region for partially fabricated NSFET 100. Alternatively, nano-sheet layers 115 can include silicon-germanium (SiGe), III-V compound semiconductors, such as gallium arsenide (GaAs), indium phosphide (InP), gallium phosphide (GaP), or gallium nitride (GaN). For example purposes, nano-sheet stacks 105 in partially fabricated NSFET 100 will be described in the context of spaced-apart Si nano-sheet layers 115. Based on the disclosure herein, other materials, as discussed above, can be used. These materials are within the spirit and scope of this disclosure. By way of example and not limitation, precursor gases that can be used for the growth of Si nano-sheet layers 115 include silane ($SiH_4$), disilane ($Si_2H_6$), any other suitable gas, or combinations thereof.

In some embodiments, the nano-sheet layers 115 can have the same or different thicknesses. According to some embodiments, the thickness of each Si nano-sheet layer 115 can range from about 5 nm to about 8 nm. In some embodiments, Si nano-sheet layers 115 have an equal width (e.g., along the x-axis of FIG. 1) that matches the width of nano-sheet multilayer stack 105. By way of example and not limitation, the width of Si nano-sheet layers 115 can range from about 15 nm to about 50 nm.

In some embodiments, each nano-sheet stack 105 can include up to about 10 to 12 total nano-sheet layers. However, additional or fewer nano-sheet layers 105 are possible depending on the design of partially fabricated NSFET 100. In some embodiments, height $105_H$ of multilayer nano-sheet stack 105 can range between about 100 nm and about 200 nm. The aforementioned thickness and height ranges for nano-sheet layers 115 and nano-sheet stacks 105 are not limiting.

Referring to FIG. 2, fin structures 120 are formed on substrate 125. By way of example and not limitation fin structures 120 and substrate 125 include a semiconductor material such as crystalline silicon. In some embodiments, fin structures 120 and substrate 125 can include (i) another elementary semiconductors such as germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof. For example purposes, fin structures 120 formed on substrate 125 will be described in the context of crystalline silicon (Si). Based on the disclosure herein, other materials, as discussed above, can be used. These materials are within the spirit and scope of this disclosure.

Fin structures 120 may formed by patterning by any suitable method. For example, fin structures 120 may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern fin structures 120.

Figure 10:
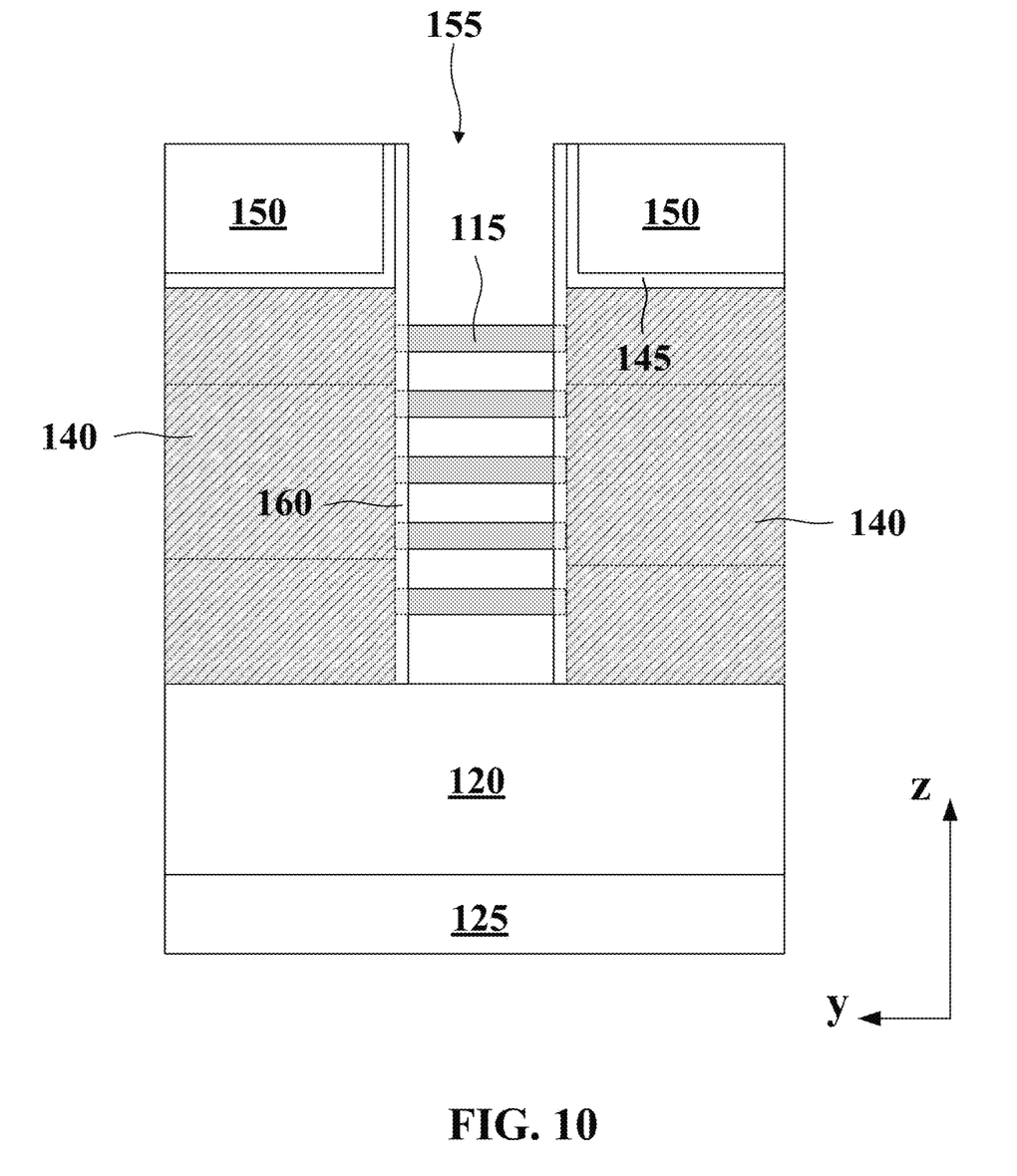
FIG. 10 is a cross sectional view of a partially fabricated gate-all-around nano-sheet FET structure, in accordance with some embodiments.

Partially fabricated NSFET 100, as shown in FIGS. 1 and 2, include additional structural elements such as liner 130, insulating layer 135, source/drain (S/D) epitaxial stacks 140 grown on fin structures 120, capping layer 145, isolation layer 150, gate stack opening 155 formed in isolation layer 150, and spacers 160 formed on sidewall surfaces of isolation layer 150 in gate stack opening 155. In some embodiments, S/D epitaxial stacks 140 extend along the y-axis within the entire thickness of isolation layer 150 and abut spacers 160. In some embodiments, sheet layers 115 traverse through spacers 160 and make contact with S/D epitaxial stacks 140 as shown in FIG. 10.

In some embodiments, insulating layer 135 can be an isolation structure, such as a shallow trench isolation (STI) that electrically isolates fin structure 120 and includes silicon oxide ($SiO_2$), silicon nitride ($Si_3N_4$), silicon oxy-nitride (SiON), fluorine-doped silicate glass (FSG), phosphorous-doped silicate glass (PSG), a low-k dielectric material (e.g., with k-value less than about 3.9), and/or other suitable dielectric materials with appropriate fill properties. In some embodiments, liner 130 is a nitride layer, such as $Si_3N_4$.

In some embodiments, epitaxial stacks 140 can be boron-doped (B-doped) SiGe stacks suitable for p-type NSFETs, or phosphorous-doped (P-doped) Si layers suitable for n-type NSFETs. In some embodiments, P-doped (n-type) Si S/D layers can be epitaxially grown using silane ($SiH_4$) precursor. A phosphorous dopant can be introduced into the Si epitaxially grown layer during growth. By way of example and not limitation, the phosphorous concentration can range from about $10^{21}$ atoms/cm$^3$ to about $8 \times 10^{21}$ atoms/cm$^3$.

Conversely, a B-doped (p-type) SiGe S/D can be an epitaxial stack that can include two or more epitaxial layers (not shown in FIG. 1) grown in succession and can feature different germanium (Ge) atomic % and different B dopant concentrations. By way of example and not limitation, a first epitaxial layer can have a Ge atomic % that ranges from 0 to about 40%, and a B dopant concentration that ranges from about $5\times10^{19}$ atoms/cm$^3$ to about $1\times10^{21}$ atoms/cm$^3$; a second epitaxial layer can have a Ge atomic % that ranges from about 20% to about 80%, and a B dopant concentration that ranges from about $3\times10^{21}$ atoms/cm$^3$ to about $5\times10^{21}$ atoms/cm$^3$; and a third epitaxial layer can be a capping layer that can have similar Ge atomic % and B dopant concentrations as the first epitaxial layer (e.g., 0 to about 40% for Ge and about $5\times10^{19}$ atoms/cm$^3$ to about $1\times10^{21}$ atoms/cm$^3$ for B dopant). The thickness of these layers can vary depending on the device performance requirements. For example, the first epitaxial layer can have a thickness range from about 10 nm to about 20 nm, the second epitaxial layer can have a thickness range from about 30 nm to about 60 nm, and the third epitaxial layer (capping layer) can have a thickness range from 0 to about 10 nm. It is noted that the aforementioned thicknesses and doping concentrations are not limiting and other thickness and doping concentrations are within the spirit and the scope of this disclosure.

In some embodiments, capping layer 145 can have a thickness that ranges from about 3 nm to about 5 nm. By way of example and not limitation, the capping layer 145 can be deposited by a conformal deposition process, such as atomic layer deposition (ALD), plasma-enhanced ALD (PEALD), chemical vapor deposition (CVD), plasma-enhanced CVD (PECVD), or any other appropriate deposition method. In some embodiments, capping layer 145 functions as an etch stop layer in a subsequent etching process during the formation of contact openings (not shown in FIG. 1) on S/D epitaxial stacks 140.

According to some embodiments, isolation layer 150 is an interlayer dielectric (ILD) that includes a silicon oxide-based dielectric material with or without carbon and/or nitrogen. Isolation layer 150 surrounds S/D epitaxial stacks 140 and is formed prior to the removal of the sacrificial gate stack, which is not shown in FIG. 1. After the removal of the sacrificial gate stack, gate stack opening 155 is formed in isolation layer 150, as shown in FIG. 1. By way of example and not limitation, isolation layer 150 can be deposited by CVD, physical vapor deposition (PVD), or any other appropriate deposition method.

Finally, spacers 160 can include a dielectric material, such as SiON, silicon carbon nitride (SiCN) silicon oxy-carbide (SiOC), Si$_3$N$_4$, or combinations thereof. In some embodiments, the thickness of spacers 160 can range from about 2 nm to about 5 nm. Spacers 160 can be a stack of one or more layers that include the same or different materials. According to some embodiments, spacers 160 are deposited on sidewall surfaces of the sacrificial gate stack, which is later removed during a gate replacement process to form gate stack opening 155. In FIG. 1, spacers 160 function as structural elements for the metal gate stack to be formed in gate stack opening 155 in subsequent operations.

Figure 3:
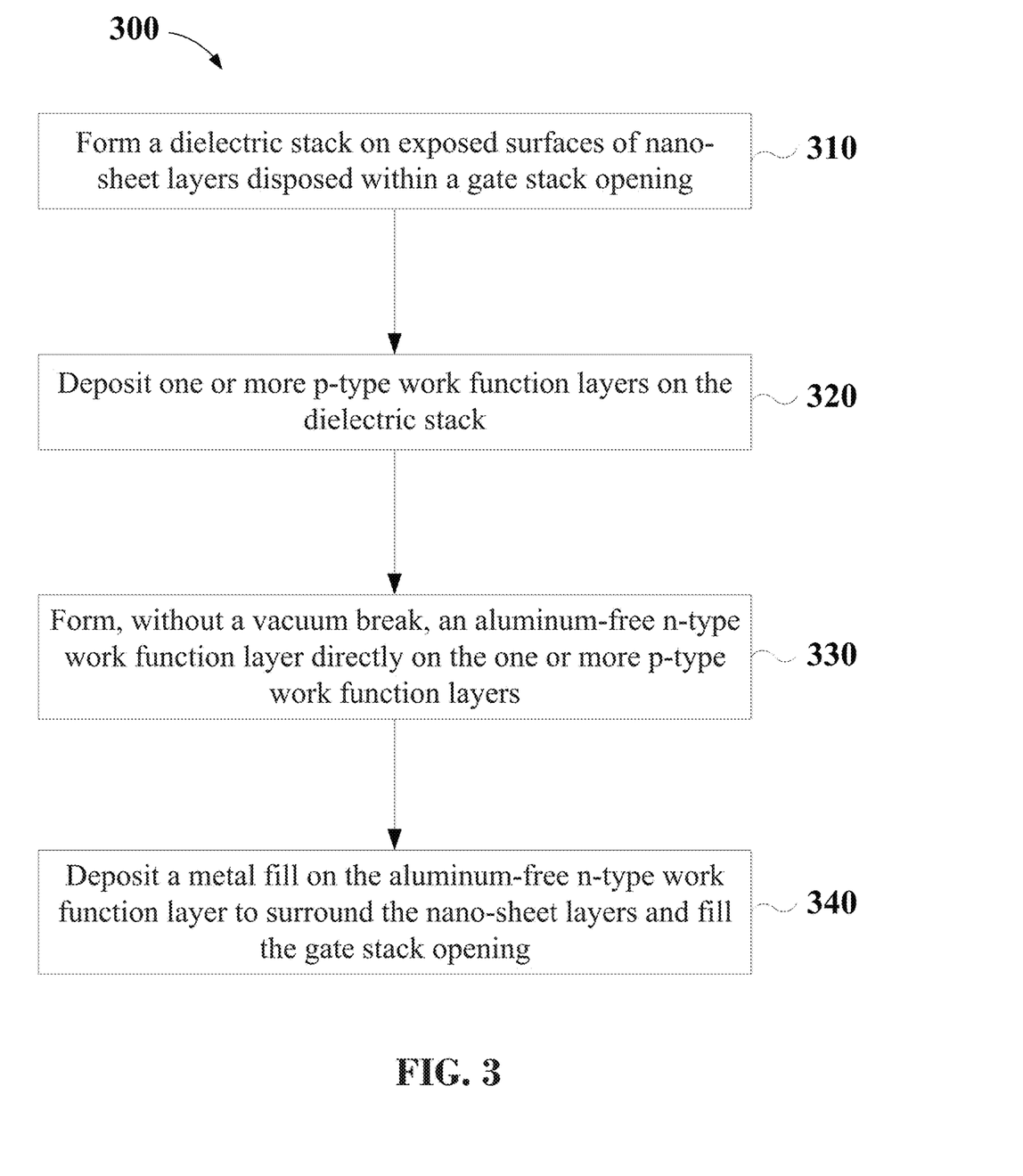
FIG. 3 is a flow diagram of a method for fabricating a gate stack with aluminum-free n-type work function layers for a gate-all-around nano-sheet FET, in accordance with some embodiments.

FIG. 3 is a flow chart of method 300 describing the fabrication of gate stacks for n-type and p-type NSFETs with aluminum-free work function layers, according to some embodiments. It is noted that fabrication method 300 may not be limited to nano-sheet transistors and can be applicable to transistors with geometries that would benefit from thinner work function layers, such as finFETs, planar FETs, nanowire FETs, etc.

Other fabrication operations may be performed between the various operations of method 300 and may be omitted merely for clarity. This disclosure is not limited to this operational description. It is to be appreciated that additional operations may be performed. Moreover, not all operations may be needed to perform the disclosure provided herein. Additionally, some of the operations may be performed simultaneously, or in a different order than shown in FIG. 3. In some embodiments, one or more other operations may be performed in addition to or in place of the presently described operations. For illustrative purposes, fabrication method 300 is described with reference to the embodiments shown in FIGS. 1, 2, and 4-8. The figures provided to describe method 300 are for illustrative purposes only and are not to scale. In addition, the figures may not reflect the actual geometry of the real structures, features, or layers. Some structures, layers, or geometries may have been deliberately augmented for illustrative purposes.

Figure 4:
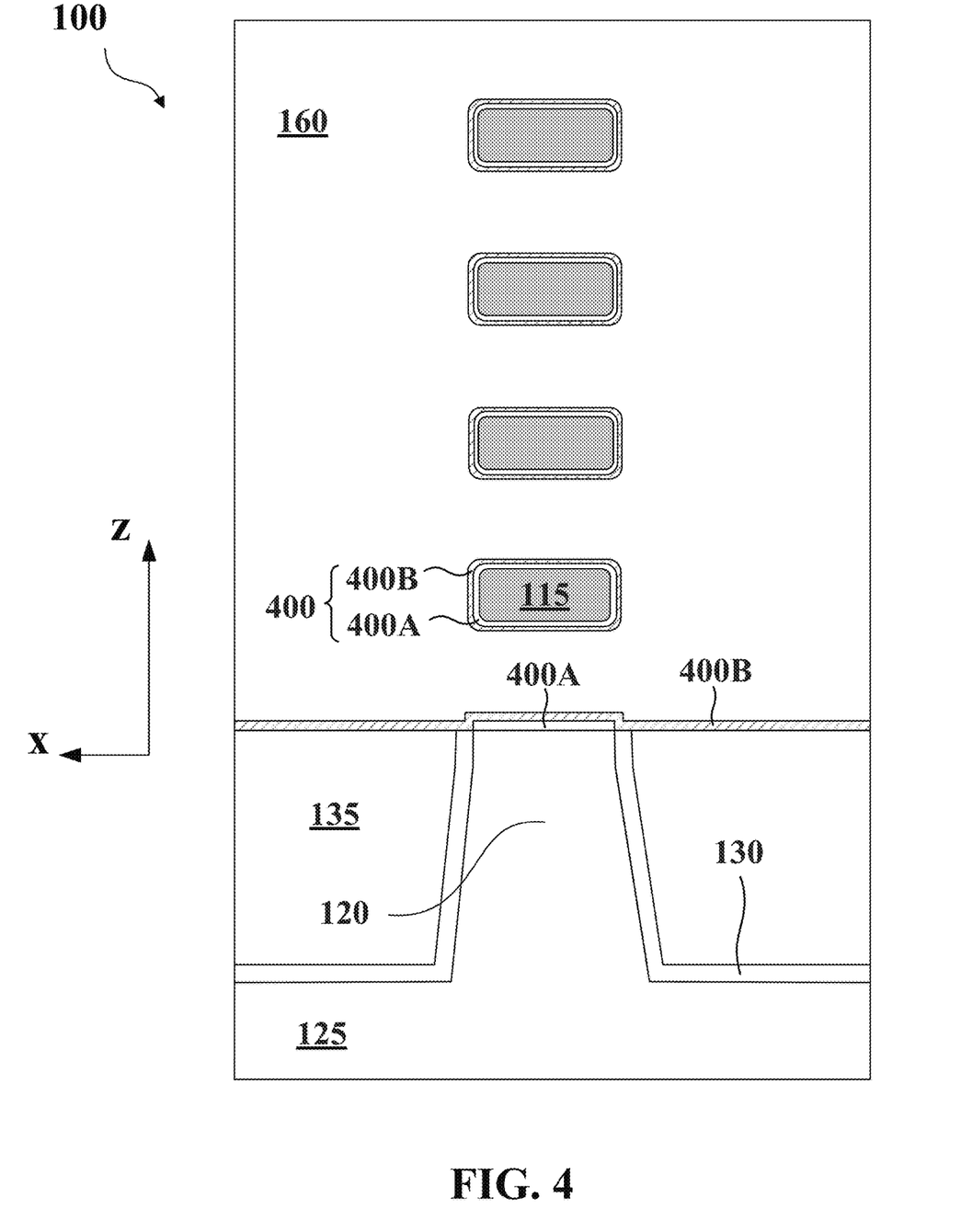
FIGS. 4-7 are cross-sectional views during the fabrication of a gate stack with aluminum-free n-type work function layers for a gate-all-around nano-sheet FET, in accordance with some embodiments.

Referring to FIG. 3, method 300 begins with operation 310 and the process of forming a dielectric stack on exposed surfaces of nano-sheet layers 115 within gate stack opening 155 shown in FIGS. 1 and 2. According to some embodiments, FIG. 4 is partially fabricated NSFET 100 shown in FIG. 1 along cut line 200 after operation 310 of method 300. In some embodiments, FIG. 4 shows partially fabricated NSFET 100 as if the viewer views nano-sheet layers 115 within gate stack opening 155 between spacers 160 and along the y-axis of FIG. 1.

According to FIG. 4, dielectric stack 400 is formed to surround the suspended nano-sheet layers 115 between spacers 160. In some embodiments, dielectric stack 400 is a gate dielectric stack that includes an interfacial layer 400A and a high-k layer 400B. It is noted that the formation of the aforementioned layers of dielectric stack 400 is not limited to nano-sheet layers 115. For example, interfacial layer 400A is also formed on surfaces of fin structure 120 not covered by insulating layer 135 (e.g., on the top surface of fin structure 120), and high-k layer 400B is also formed on insulating layer 135 and on interfacial layer 400A over fin structure 120.

In some embodiments, interfacial layer 400A is formed by exposing the silicon surfaces of nano-sheet layers 115 to an oxidizing ambient. By way of example and not limitation, the oxidizing ambient can include a combination of ozone (O$_3$), ammonia hydroxide/hydrogen peroxide/water mixture (SC1), and hydrochloric acid/hydrogen peroxide/water mixture (SC2). As a result of the aforementioned oxidation process, a SiO$_2$ layer between about 5 Å and about 15 Å is formed on exposed silicon surfaces—e.g., the surfaces of fin structure 120 not covered by insulating layer 135 and nano-sheet layers 115.

In some embodiments, high-k layer 400B is a dielectric with a dielectric constant (k-value) higher than about 3.9. By way of example and not limitation, high-k layer 400B can include hafnium oxide, lanthanum oxide, aluminum oxide, yttrium oxide, or combinations thereof deposited by ALD or PEALD at a thickness between about 10 Å and about 20 Å.

In some embodiments, following the deposition of dielectric stack 400, a series of sacrificial capping layers and spike annealing operations can be performed to improve the electrical characteristics of dielectric stack 400. By way of example and not limitation, a first sacrificial capping layer, not shown in FIG. 4, can be deposited on dielectric stack 400 followed by a first spike annealing in nitrogen ambient to improve the quality of high-k layer 400B. By way of example and not limitation, the first sacrificial capping layer can include titanium-silicon-nitride (TiSiN) and be deposited by an ALD process using titanium tetrachloride (TiCl$_4$), silane (SiH$_4$), and ammonia (NH$_3$) at a thickness between about 10 Å and 20 Å. Further, the first spike annealing can be performed at a temperature range between about 850° C. and about 950° C. for about 1 s or less.

In some embodiments, a second sacrificial capping layer, not shown in FIG. 4, may be deposited on the first sacrificial capping layer followed by a second spike annealing in nitrogen ambient at an annealing temperature between about 900° C. and about 950° C. According to some embodiments, the second spike annealing promotes (i) partial intermixing between interfacial layer 400A and high-k layer 400B, and (ii) the formation of electrical dipoles in dielectric stack 400 that can help set the work function primarily for the p-type NSFETs. By way of example and not limitation, the second sacrificial capping layer can be a silicon layer deposited by a CVD process using disilane (Si$_2$H$_6$) and hydrogen at a temperature between about 350° C. and about 450° C. In some embodiments, the second sacrificial capping layer can be deposited at a thickness between about 20 Å and about 30 Å.

In some embodiments, the first and second sacrificial capping layers are removed prior to performing a third spike annealing between about 850° C. and about 950° C. According to some embodiments, the third spike annealing is performed in NH; to incorporate nitrogen into high-k layer 400B and to improve the overall reliability of dielectric stack 400.

Figure 5:
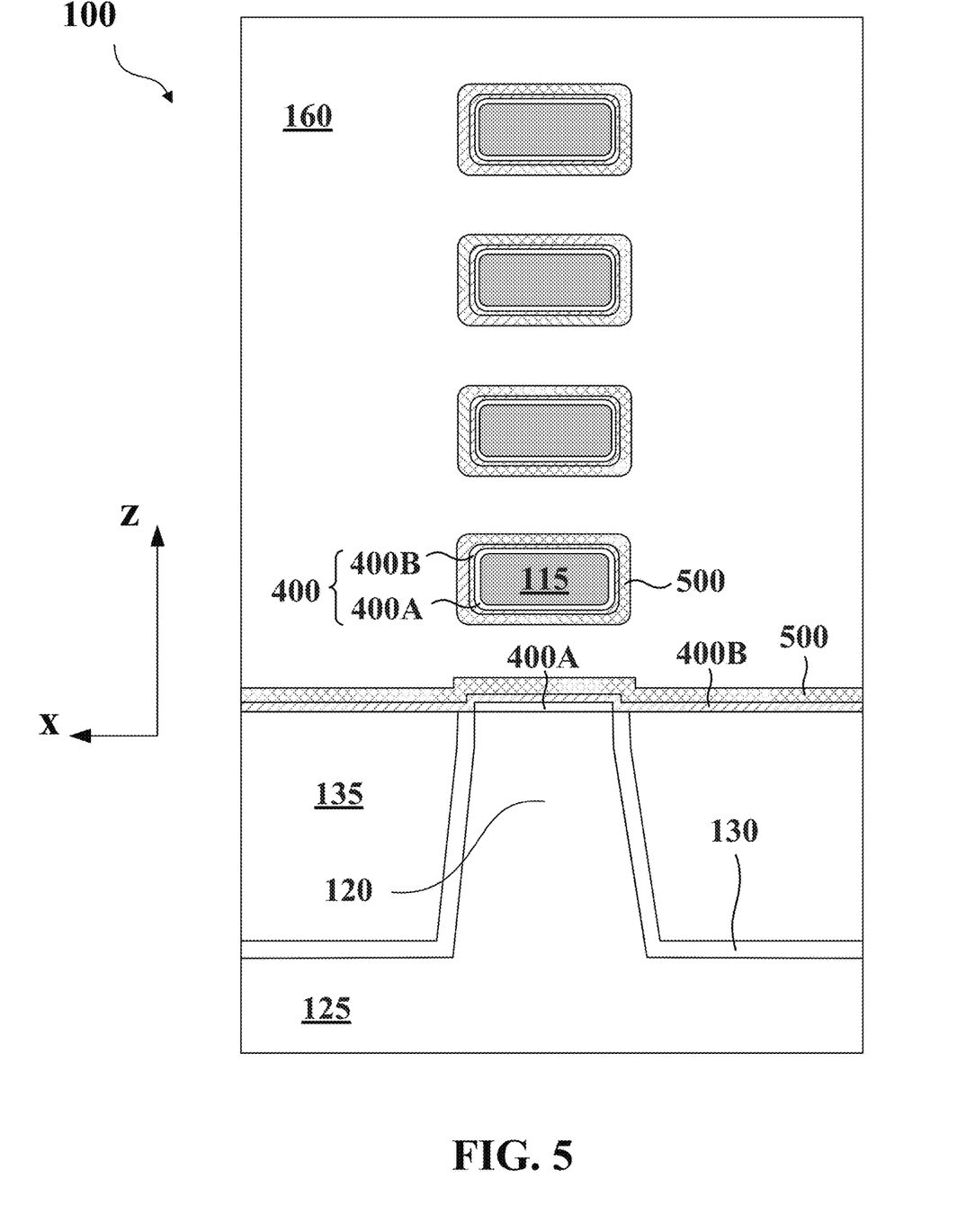

Referring to FIGS. 3 and 5, method 300 continues with operation 320 and the process of depositing one or more p-type work function layers directly on dielectric stack 400 to form a p-type work function stack 500 shown in FIG. 5. The term "p-type work function layer" as used herein refers to work function layers responsible for tuning, primarily, the threshold voltage of p-type NSFETs, and to a much lesser degree the threshold voltage of the n-type NSFETs. For ease of fabrication, p-type work function layers are present on both n-type and p-type NSFETs. In some embodiments, each p-type work function layer includes titanium and/or nitrogen (e.g., in the form of titanium nitride (TiN)) and has a thickness between about 5 Å and about 35 Å.

The threshold voltage tuning for a p-type transistor can be accomplished by controlling the number of p-type work function layers or the total thickness of p-type work function stack 500. For example, the greater the number of p-type work function layers in p-type work function stack 500, or the thicker the p-type work function stack 500, the lower the threshold voltage value for the p-type transistor. Therefore, it is possible to form, within the same chip, transistors with different threshold voltages for different power applications as discussed above. As discussed above, the presence of p-type work function layers has a strong effect on p-type NSFETs, while n-type NSFET may be unaffected by the presence of the p-type work function layers. In some embodiments, n-type NSFETs receive fewer number of p-type work function layers, or feature a thinner p-type work function layer stack 500, compared to the p-type NSFETs.

Transistors with a different number of p-type work function layers, or with p-type work function stacks 500 having different thicknesses, can be accomplished by photolithography and etching operations. By way of example and not limitation, the first p-type work function layer can be deposited concurrently on both n-type and p-type transistors of the chip. In some embodiments, transistors receiving the largest number of p-type work function layers are subsequently masked with a photoresist so that the first p-type work function layer can be removed via etching from the transistors receiving fewer p-type work function layers. Once the first p-type work function layer has been removed from the transistors receiving fewer p-type work function layers, the photoresist is removed from the transistors receiving the largest number of p-type work function layers and the process resumes with a second p-type work function layer deposition. A photoresist is subsequently used to mask the transistors receiving the largest and the second largest number of p-type work function layers. A subsequent etching process removes the second p-type work function layer from the transistors receiving fewer p-type work function layers from the transistors with the largest and the second largest number of p-type work function layers. The aforementioned sequence repeats until all the transistors (p-type and n-type) receive the appropriate number of p-type work function layers (e.g., 1 to 3 for n-type NSFETs and 4 to 6 for p-type NSFETs).

Following the process described above, the last p-type work function layer (e.g., the topmost layer) in p-type work function stack 500 is deposited concurrently on all the transistors (p-type and n-type). The aforementioned p-type work function layer formation sequence is not limiting and other sequences using similar or different operations may be performed. However, it is important for method 300 that the last p-type work function layer (e.g., the topmost layer) of p-type work function stack 500 is common for both n-type and p-type transistors as discussed above.

By way of example and not limitation, each p-type work function layer of p-type work function stack 500 can be deposited with an ALD process using TiCl$_4$ and NH$_3$ at a deposition temperature between about 400° C. and about 450° C. Further, removal of the p-type work function layer can be achieved with an SC1 or SC2 wet clean after the removal of the photoresist. As discussed above, each p-type work function layer in p-type work function stack 500 can have a different thickness since it is being deposited independently.

Referring to FIG. 3 method 300 continues with operation 330 and the process of forming, without a vacuum break, an aluminum-free n-type work function layer (i.e., an n-type work function layer that does not include aluminum) directly on the one or more p-type work function layers. In other words, and referring to FIG. 6, the formation of an aluminum-free n-type work function layer 600 of operation 330 follows the deposition of the last p-type work function layer of p-type work function layer stack 500 without a vacuum break (e.g., in-situ). This means that the formation of aluminum-free n-type work function layer 600 can occur either in the same deposition reactor used for the p-type work function layer, or in a different reactor mounted on the same mainframe with the deposition reactor used for the p-type work function layer. In some embodiments, aluminum-free n-type work function layer 600 includes a metal silicide such as TiSi$_x$, TaSi$_x$, CoSi$_x$, or NiSi$_x$ and is deposited on both n-type and p-type NSFETs. For example purposes, aluminum-free n-type work function layer 600 will be described in the context of TiSi$_x$ or TaSi$_x$. Based on the disclosure herein, other materials, as discussed above, can be used. These materials are within the spirit and scope of this disclosure.

Figure 6:
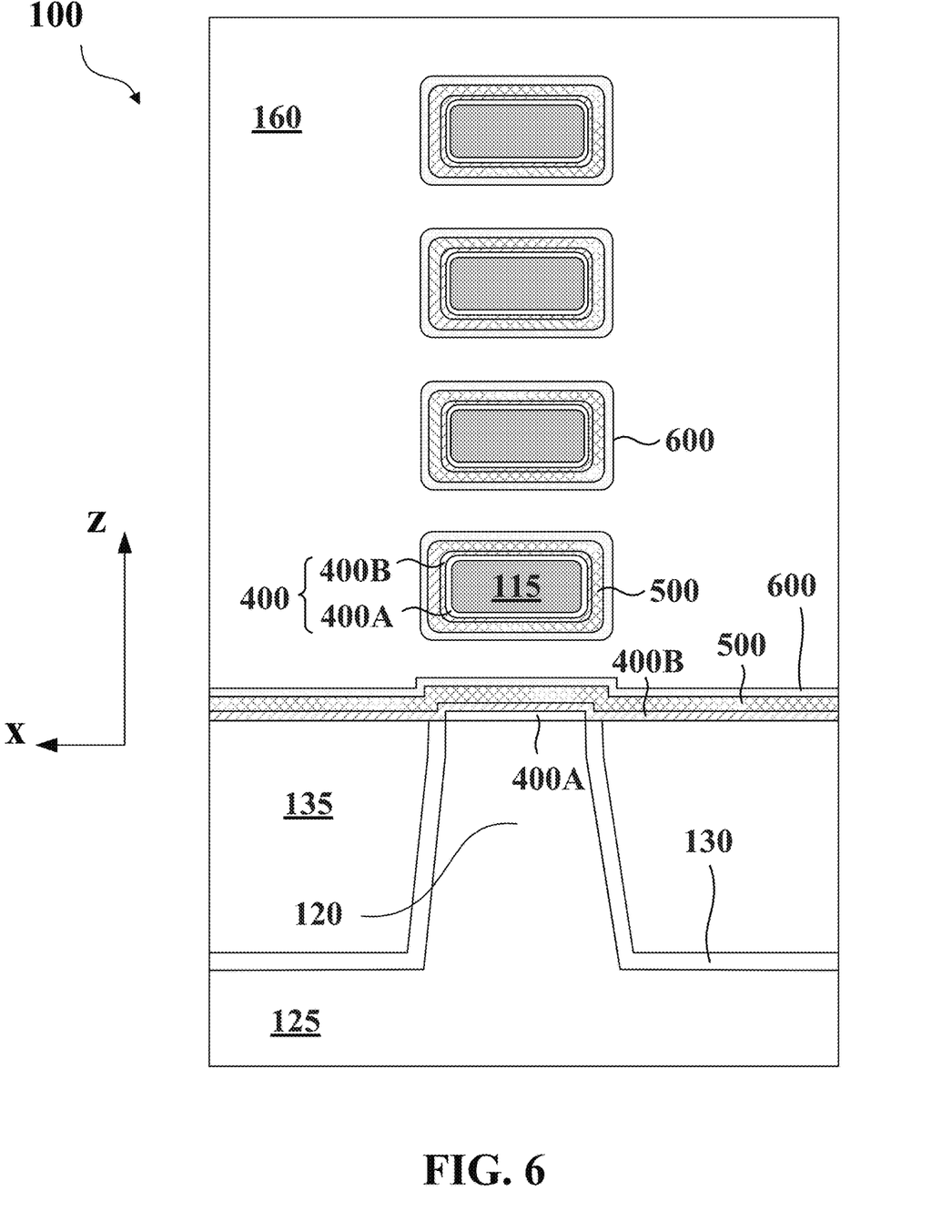

According to some embodiments, aluminum-free n-type work function layer 600 can be formed by an ALD process that includes soaking the last-deposited p-type work function layer of p-type work function stack 500 successively in TiCl$_4$ (or tantalum chloride (TaCl$_5$)) vapors and SiH$_4$ gas to form a TiSi$_x$ (or TaSi$_x$) layer with a thickness between about 5 Å and about 10 Å. The first soak in TiCl$_4$ (or TaCl$_5$) vapors can last from about 50 s to about 150 s and the second soak in the SiH$_4$ gas can last from about 180 s to about 400 s. In some embodiments, shorter soaking times than 50 s and 180 s for TiCl$_4$ (or TaCl$_5$) vapors and SiH$_4$ gas respectively may not yield a fully formed aluminum-free n-type work function layer 600 and may require more than two consecutive soaks, which can add to the overall processing time. Conversely, longer soaking times than 150 s and 400 s for TiCl$_4$ (or TaCl$_5$) vapors and SiH$_4$ gas respectively may unnecessarily extend the processing time and increase the manufacturing cost.

In some embodiments, after the first soak, excess TiCl$_4$ (or TaCl$_5$) vapors are evacuated from the reactor (e.g., pumped out) prior to the introduction of the SiH$_4$ gas to prevent gas-phase reactions between the vapors and the gas, which can uncontrollably increase the growth rate of the formed aluminum-free n-type work function layer 600. According to some embodiments, TiCl$_4$ (or TaCl$_5$) molecules from the vapors are chemisorbed on the surface of p-type work function stack 500 and chemically react with the SiH$_4$ gas to form the TiSi$_x$ (or TaSi$_x$) layer (e.g., aluminum-free n-type work function layer 600). In some embodiments, more than two consecutive soaks may be required based on the processing conditions as described above.

As discussed above, both the first soak in TiCl$_4$ (or TaCl$_5$) vapors and the second soak in SiH$_4$ gas are performed in-situ (e.g., without a vacuum break) with respect to the p-type work function layer deposition process. This is to prevent introduction of molecular oxygen between p-type work function stack 500 and aluminum-free n-type work function layer 600 from a potential vacuum break, which can offset the threshold voltage of the transistors from the desired value. In some embodiments, TiSi$_x$ (or TaSi$_x$) n-type work function layers are more oxidation resistant than TiAl, TiAlC n-type work function layers. Therefore, TiSi$_x$ (or TaSi$_x$) n-type work function layers can be formed thinner than TiAl, TiAlC n-type work function layers but offer equivalent threshold voltage modulation. For example, TiSi$_x$ (or TaSi$_x$) n-type work function layers can be formed to be about 10 Å or thinner than TiAl, TiAlC n-type work function layers. As discussed above, thinner n-type work function layers can alleviate the gap fill problems in gate stacks of NSFETs with nano-sheet spacing between about 8 nm and about 12 nm.

In some embodiments, aluminum-free n-type work function layer 600 is formed at a temperature range between about 400° C. and about 450° C., which favorably matches the deposition temperature of p-type work function layers.

According to some embodiments, and as shown in FIG. 6, aluminum-free n-type work function layer 600 is also formed at the bottom of gate stack opening 155 on p-type work function stack 500 over insulating layer 135 and fin structure 120.

Figure 7:
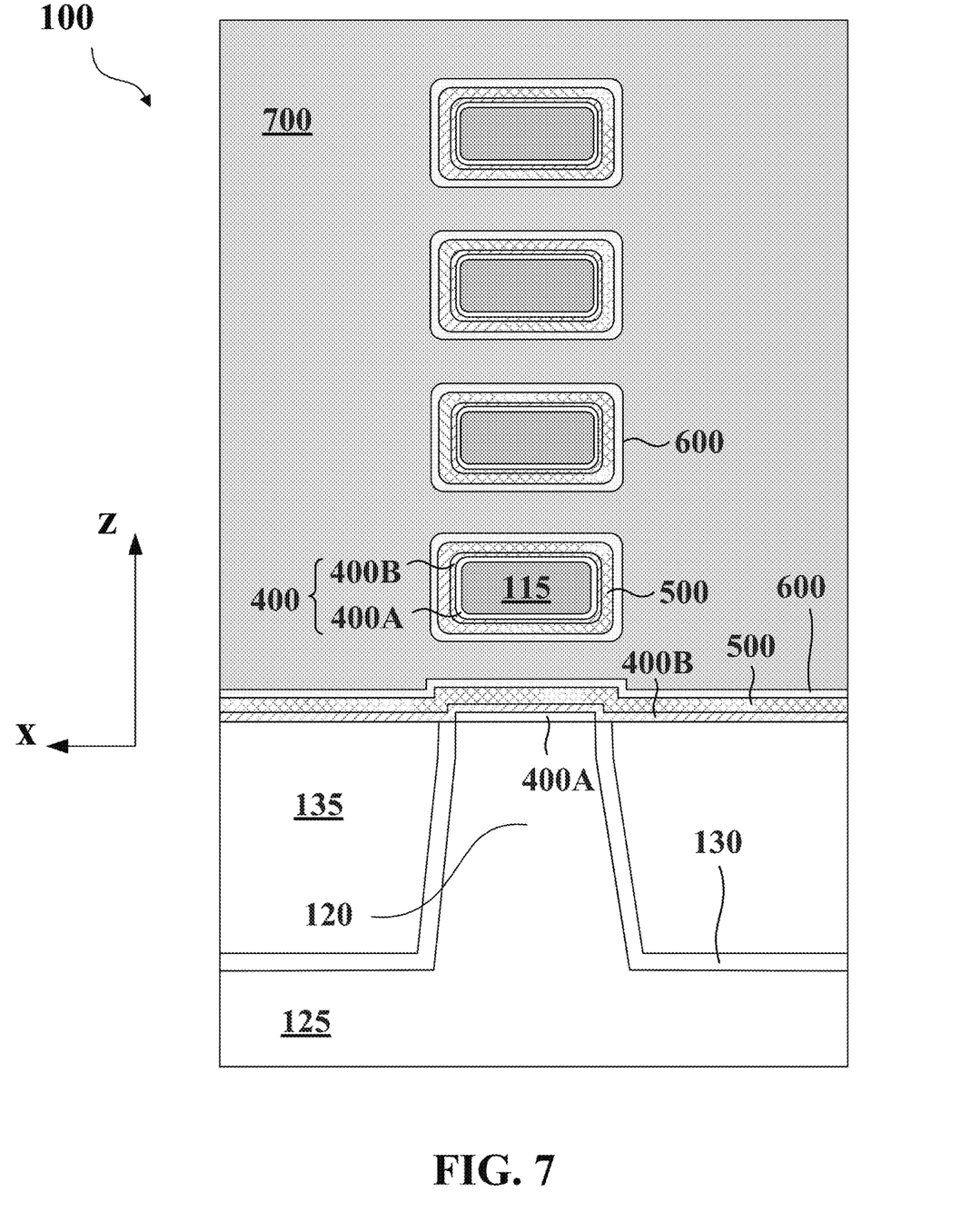

Referring to FIG. 3, method 300 continues with operation 340 and the process of depositing a metal fill on aluminum-free n-type work function layer 600 to surround nano-sheet layers 115 and fill gate stack opening 155 shown in FIGS. 1 and 2. By way of example and not limitation, FIG. 7 shows partially fabricated NSFET 100 after the formation of metal fill 700 according to operation 340 of method 300. In some embodiments, metal fill 700 includes a nucleation layer, not shown in FIG. 7, having a thickness between about 15 Å and about 30 Å. In some embodiments, metal fill 700 includes tungsten (W) metal deposited by CVD using tungsten hexafluoride (WFR) and hydrogen (H$_2$) at a temperature range between about 300° C. and about 400° C. Fluorine-free W nucleation layer (i.e., a nucleation layer that does not include fluorine) can be deposited with an ALD process using a tungsten (V) chloride (W$_2$Cl$_{10}$) at a temperature range between about 400° C. and about 480° C. In some embodiments, the fluorine-free nucleation layer acts as a glue layer for metal fill 700 and as a diffusion barrier for fluorine.

Figure 8:
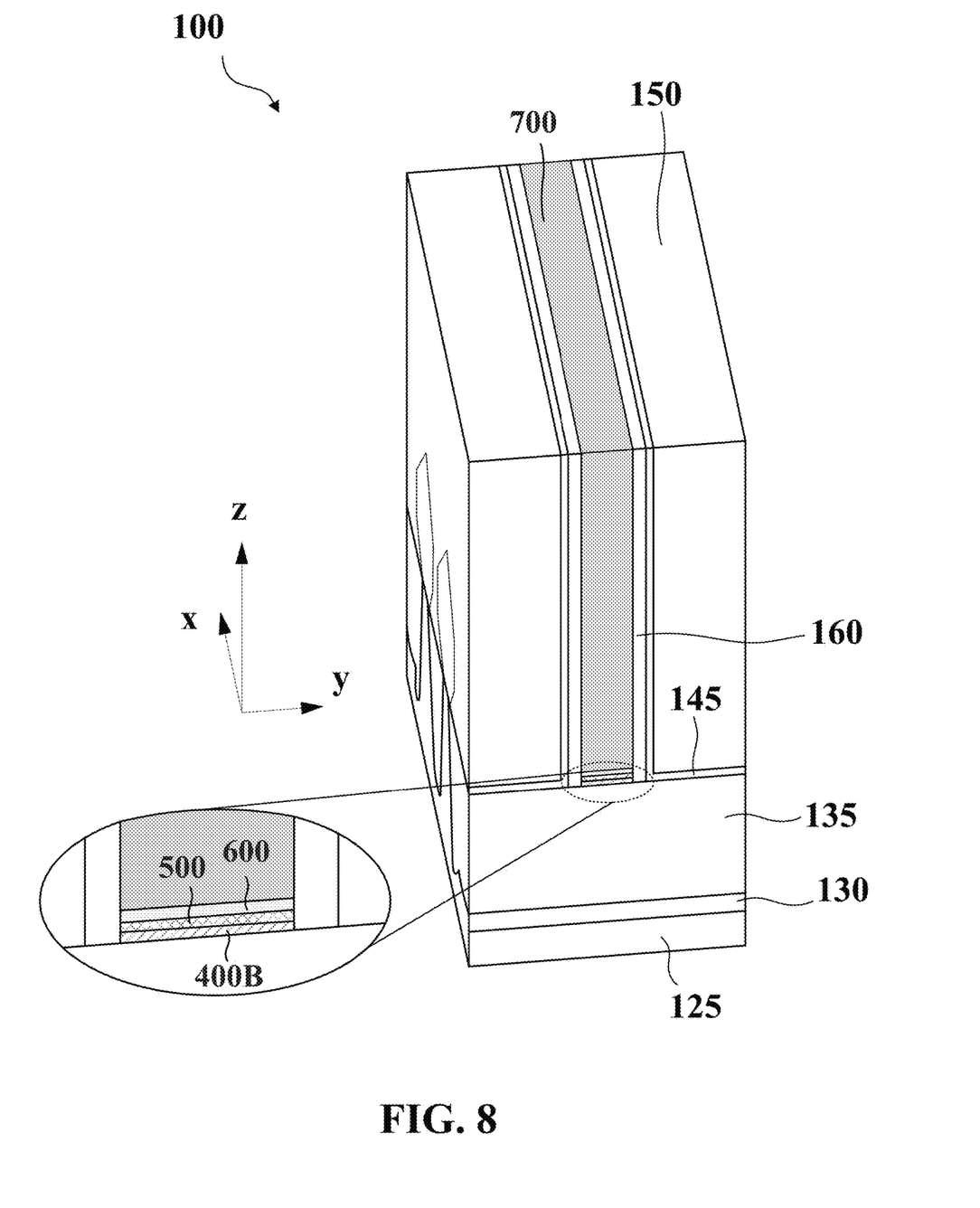
FIG. 8 is an isometric view of a gate-all-around nano-sheet FET structure with aluminum-free n-type work function layers, in accordance with some embodiments.

In some embodiments, dielectric stack 400, p-type work function stack 500, aluminum-free n-type work function layer 600, and metal fill 700 collectively form a gate stack that surrounds nano-sheet layers 115 and fills the gate stack opening. By way of example, and not limitation, FIG. 8 shows the resulting NSFET 100 after the completion of method 300 described in FIG. 3.

Figure 9A:
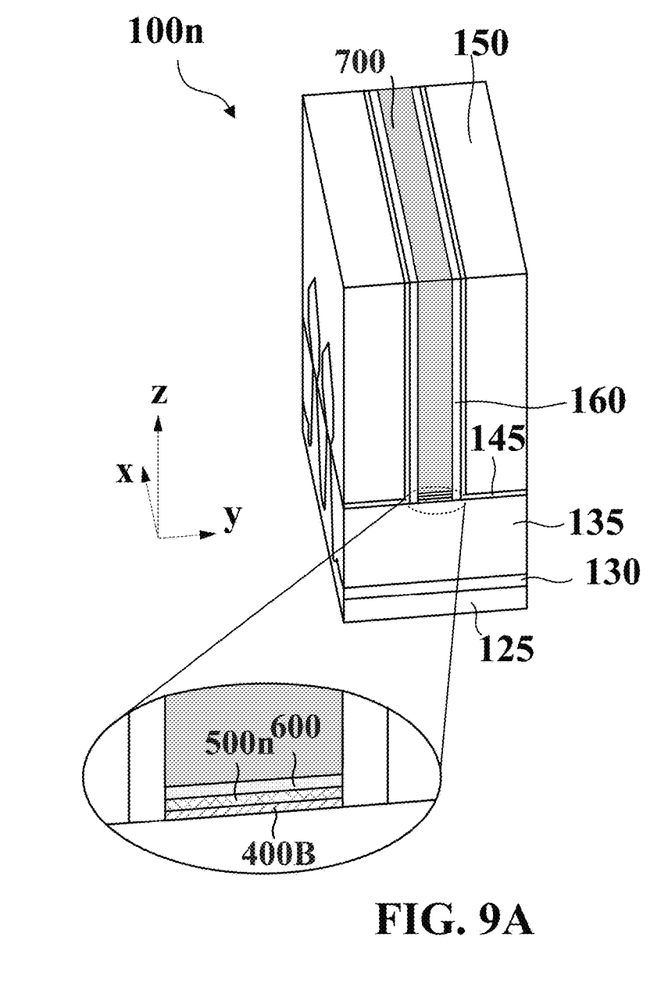
FIGS. 9A and 9B are isometric views of respective n-type and p-type gate-all-around nano-sheet FET structures with aluminum-free n-type work function layers, in accordance with some embodiments.
Figure 9B:
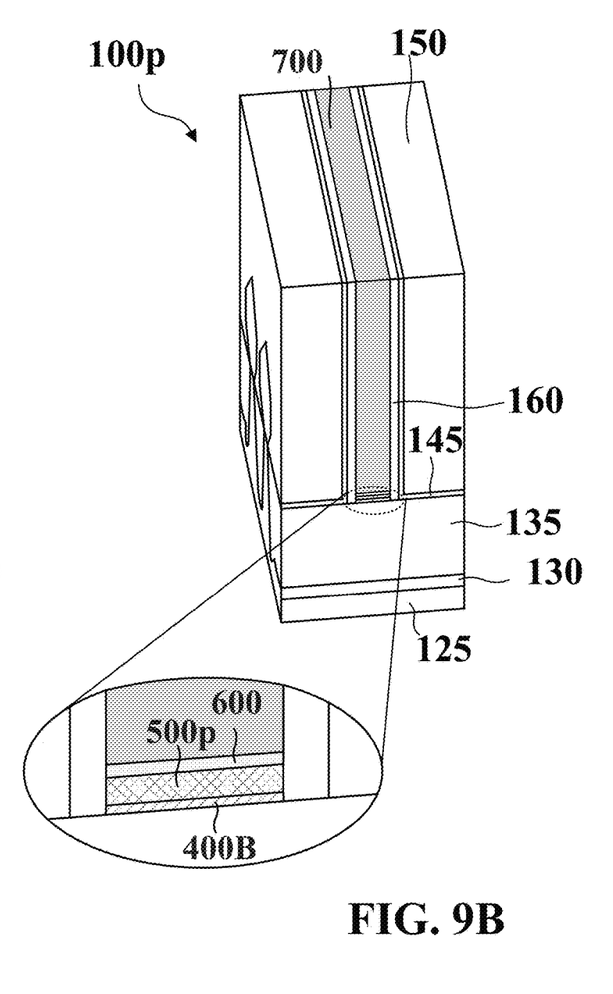

By way of example and not limitation, FIGS. 9A and 9B are isometric views of n-type NSFET 100n and p-type NSFET 100p formed using method 300 shown in FIG. 3. As discussed above, p-type work function stack 500n of n-type NSFET 100n includes fewer p-type work function layers than p-type work function stack 500p of p-type NSFET 100p. For this reason, p-type work function stack 500n of n-type NSFET 100n appears thinner than p-type work function stack 500p of p-type NSFET 100p.

Figure 11:
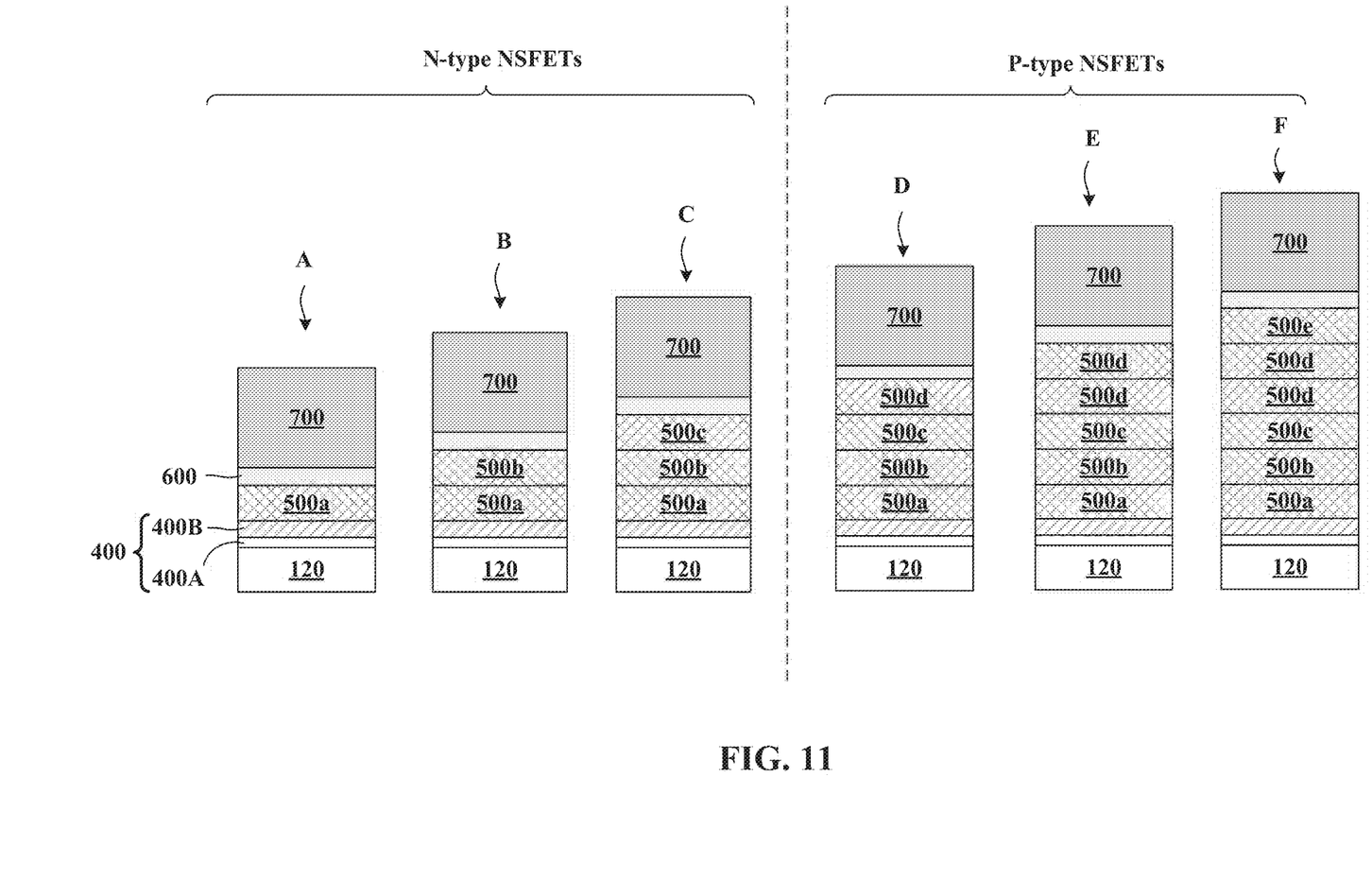
FIG. 11 shows cross-sectional views of n-type nano-sheet FETs and p-type nano-sheet FETs formed using method of FIG. 3, in accordance with some embodiments.

By way of example and not limitation, FIG. 11 shows cross-sectional views of n-type NSFETs A, B, and C, and p-type NSFETs D, E, and F formed using method 300. As discussed above, p-type NSFETs D, E, and F have a greater number of p-type work function layers 500x (where x is 'a' through 'e') than n-type NSFETs A, B, and C. In the example of FIG. 11, n-type NSFETs A, B, and C can have up to 3 p-type work function layers 500a, 500b, and 500c while p-type NSFETs D, E, and F can have up to 6 work function layers (e.g., 500a through 500e). In some embodiments, the threshold voltage of an n-type NSFET increases as the number of p-type work function layer increases. For example, n-type NSFET A has a lower threshold voltage that n-type NSFET B and C, and n-type NSFET B has a lower threshold voltage than n-type NSFET C. In contrast, the threshold voltage of p-type NSFETs decreases as the number of p-type work function layers increases. For example p-type NSFET D has a larger threshold voltage than p-type NSFET E and F, and p-type NSFET E has a larger threshold voltage than p-type NSFET F.

According to some embodiments, method 300 is not limited to gate all around nano-sheet FETs but can be applicable to other transistors such as finFETs, planar transistors, or transistors where n-type work function layers need to be grown thinner due to scaling requirements.

The embodiments described herein are directed to a method for the fabrication of transistors with aluminum-free n-type work function layers as opposed to aluminum-based n-type work function layers, such as TiAl and TiAlC. According to some embodiments, the aluminum-free n-type work function layers can have a thickness between about 0.5 nm and about 1.5 nm, which is at least about 10 Å thinner than aluminum-based n-type work function layers. As a result, the aluminum-free n-type work function layers described herein can mitigate the challenges arising from poor gate stack gap fill, such as high gate stack resistance and reliability concerns which are present in transistors with challenging gate stack geometries. In some embodiments, the aluminum-free n-type work function layers include TiSi$_x$, TaSi$_x$, CoSi$_x$, or NiSi$_x$. According to some embodiments, the aluminum-free work function layers described herein are grown in-situ (e.g., without a vacuum break) with the p-type work function layers. Therefore, undesirable oxygen incorporation in the work function layers can be prevented or mitigated.

In some embodiments, a semiconductor structure includes a fin structure on a substrate and a vertical stack on the fin structure. The vertical stack includes a first portion and a second portion where each first and second portions having alternating first and second nano-sheet layers. The vertical stack further includes a third portion with the second nano-sheet layers and no first nano-sheet layers disposed between the first and second portions, where the second nano-sheet layers extend from the first portion through the third portion to the second portion of the vertical stack. The semiconductor structure further includes a gate structure disposed on the third portion of the vertical stack. Further, the gate structure surrounds the second nano-sheet layers in the third portion and includes a dielectric stack formed on the second nano-sheet layers in the third portion, a work function stack on the dielectric stack, an aluminum-free work function layer on the work function stack, and a metal fill surrounding the second nano-sheet layers in the third portion and between the first and second portions of the vertical stack.

In some embodiments, a semiconductor structure includes a nano-sheet channel portion disposed between spaced apart source/drain epitaxial layers, where the nano-sheet channel portion comprises two or more nano-sheet layers vertically stacked and spaced apart. The semiconductor structure also includes a gate stack disposed on the nano-sheet channel portion surrounding the two or more nano-sheet layers of the nano-sheet channel portion, where the gate stack includes a dielectric layer disposed on the two or more nano-sheet layers of the nano-sheet channel portion, one or more p-type work function layers on the dielectric layer, an aluminum-free n-type work function layer on the one or more p-type work function layers, and a metal between the two or more nano-sheet layers of the nano-sheet channel portion.

In some embodiments, a method includes forming a channel portion disposed between spaced apart source/drain epitaxial layers and forming a gate stack on the channel portion, where forming the gate stack includes depositing a high-k dielectric layer on the channel portion and depositing a p-type work function layer on the dielectric layer. After depositing the p-type work function layer, forming without a vacuum break, an aluminum-free n-type work function layer on the p-type work function layer and depositing a metal on the aluminum-free n-type work function layer. The method further includes depositing an insulating layer to surround the spaced apart source/drain epitaxial layers and the gate stack.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a channel portion disposed between spaced apart source/drain epitaxial layers;
   forming a gate stack on the channel portion, wherein forming the gate stack comprises:
   depositing a high-k dielectric layer on the channel portion;
   depositing a p-type work function layer on the high-k dielectric layer;
   after depositing the p-type work function layer, forming without a vacuum break, an aluminum-free n-type work function layer on the p-type work function layer and wrapped around the channel portion;
   depositing a metal on the aluminum-free n-type work function layer; and
   depositing an insulating layer to surround the spaced apart source/drain epitaxial layers and the gate stack.

2. The method of claim 1, wherein forming the aluminum-free n-type work function layer comprises:
   exposing the p-type work function layer to titanium tetrachloride vapors for about 50 s to about 150 s; and
   after exposing the p-type work function layer to the titanium tetrachloride vapors, exposing the p-type work function layer to silane gas for about 180 s to about 400 s to form titanium silicide.

3. The method of claim 1, wherein forming the aluminum-free n-type work function layer comprises:
   exposing the p-type work function layer to tantalum chloride vapors for about 50 s to about 150 s; and
   after exposing the p-type work function layer to the tantalum chloride vapors, exposing the p-type work function layer to silane gas for about 180 s to about 400 s to form tantalum silicide.

4. The method of claim 1, wherein forming the aluminum-free n-type work function layer comprises depositing the aluminum-free n-type work function layer with a thickness between about 5 Å and about 15 Å.

5. The method of claim 1, wherein forming the aluminum-free n-type work function layer comprises depositing the aluminum-free n-type work function layer at a temperature between about 400° C. and about 450° C.

6. The method of claim 1, wherein forming the aluminum-free n-type work function layer comprises depositing titanium silicide, tantalum silicide, cobalt silicide, or nickel silicide.

7. A method, comprising:
   forming a stack of nano-sheets on a semiconductor substrate;
   forming an isolation layer around the nano-sheets;
   forming a gate stack opening in the isolation layer;
   forming spacers on sidewall surfaces of the isolation layer in the gate stack opening;
   forming, within the gate stack opening,
      a dielectric stack;
      a p-type work function stack on the dielectric stack; and
      an aluminum-free n-type work function layer in contact with the p-type work function stack and wrapped around the nano-sheets; and
   filling the gate stack opening with metal to form a nano-sheet field effect transistor (NSFET) having a metal gate that surrounds the nano-sheets.

8. The method of claim 7, wherein forming the p-type work function stack comprises forming one or more p-type work function layers, and wherein the NSFET is an n-type NSFET.

9. The method of claim 7, wherein forming the p-type work function stack comprises forming a plurality of p-type work function layers, and wherein the NSFET is a p-type NSFET.

10. The method of claim 7, wherein forming the p-type work function stack comprises depositing one or more p-type work function layers using an atomic layer deposition (ALD) process.

11. The method of claim 7, wherein forming the aluminum-free n-type work function layer comprises depositing a metal silicide using an atomic layer deposition (ALD) process.

12. The method of claim 7, wherein filling the gate stack opening with metal comprises depositing a metal fill on the aluminum-free n-type work function layer.

13. The method of claim 12, wherein depositing the metal fill comprises:
depositing a tungsten nucleation layer using an atomic layer deposition (ALD) process; and
depositing a tungsten metal using a chemical vapor deposition (CVD) process.

14. A method, comprising:
forming source and drain regions in contact with a channel portion on a semiconductor substrate;
forming an insulation region outside the source and drain regions;
forming a gate stack opening in the insulation region;
forming spacers on sidewall surfaces of the insulation region in the gate stack opening;
forming, within the gate stack opening,
a dielectric stack on the channel portion;
a p-type work function stack on the dielectric stack; and
an aluminum-free n-type work function layer in contact with the p-type work function stack and wrapped around the channel portion; and
filling the gate stack opening with metal to form a metal gate.

15. The method of claim 14, wherein:
forming the source and drain regions comprises forming a fin structure oriented transverse to the semiconductor substrate; and
filling the gate stack opening with metal comprises forming a metal gate that wraps around at least three sides of the fin structure.

16. The method of claim 15, wherein:
forming the fin structure comprises forming nanowires oriented substantially parallel to a surface of the semiconductor substrate; and
filling the gate stack opening with metal comprises forming a metal gate that surrounds the nanowires.

17. The method of claim 15, wherein:
forming the fin structure comprises forming nano-sheets oriented substantially parallel to a surface of the semiconductor substrate; and
filling the gate stack opening with metal comprises forming a metal gate that surrounds the nano-sheets.

18. The method of claim 14, wherein:
forming the source and drain regions comprises forming doped regions above a substantially planar surface of the semiconductor substrate; and
filling the gate stack opening with metal comprises forming a metal gate above the substantially planar surface of the semiconductor substrate.

19. The method of claim 14, wherein forming the aluminum-free n-type work function layer comprises depositing one or more atomic layers of a metal silicide to a thickness in the range of about 0.5 nm to about 1.5 nm.

20. The method of claim 14, wherein forming the source and drain regions comprises epitaxially growing the source and drain regions.

* * * * *